(12) United States Patent
Yi-Lung

(10) Patent No.: US 7,054,165 B2
(45) Date of Patent: May 30, 2006

(54) PLACEMENT STRUCTURE OF AN INTEGRATED MOTHERBOARD FOR SMALL FORM FACTOR COMPUTER

(75) Inventor: Kuo Yi-Lung, Keelung (TW)

(73) Assignee: Shuttle Inc., Taipei (TW)

( * ) Notice: Subject to any disclaimer, the term of this patent is extended or adjusted under 35 U.S.C. 154(b) by 0 days.

(21) Appl. No.: 10/631,462

(22) Filed: Jul. 31, 2003

(65) Prior Publication Data

US 2004/0184254 A1    Sep. 23, 2004

Related U.S. Application Data

(60) Provisional application No. 60/456,425, filed on Mar. 20, 2003.

(51) Int. Cl.
H05K 7/02   (2006.01)
H05K 7/04   (2006.01)

(52) U.S. Cl. ............... 361/810; 361/760; 361/720; 361/741

(58) Field of Classification Search ........... 361/760, 361/720, 741, 730, 752, 797, 810, 807, 736, 361/748; 211/41.17
See application file for complete search history.

(56) References Cited

U.S. PATENT DOCUMENTS

| | | | |
|---|---|---|---|
| 2,948,518 A | 8/1960 | Kraus | |
| 4,643,245 A | 2/1987 | Smoot, III et al. | |
| 5,270,572 A | 12/1993 | Nakajima et al. | |
| 5,390,734 A | 2/1995 | Voorhees et al. | |
| 5,446,619 A | 8/1995 | Madsen et al. | |
| 5,473,507 A | 12/1995 | Schwegler et al. | |
| 5,505,533 A | 4/1996 | Kammersqard et al. | |
| 5,586,865 A | 12/1996 | Yin | |
| 5,600,538 A | 2/1997 | Xanthopoulos | |
| 5,684,674 A | 11/1997 | Yin | |
| 5,691,883 A | 11/1997 | Nelson | |
| 5,701,231 A | 12/1997 | Do et al. | |
| 5,934,368 A | 8/1999 | Tanaka et al. | |
| 5,964,279 A | 10/1999 | Mochizuki et al. | |
| 5,982,616 A | 11/1999 | Moore | |
| 6,034,870 A | 3/2000 | Osborn et al. | |
| 6,094,345 A | 7/2000 | Diemunsch | |
| 6,094,347 A | 7/2000 | Bhatia | |
| 6,108,731 A * | 8/2000 | Suzuki et al. | 710/301 |
| 6,134,108 A | 10/2000 | Patel et al. | |
| 6,299,408 B1 | 10/2001 | Bhatia | |
| 6,301,104 B1 * | 10/2001 | Hu | 361/684 |
| 6,307,742 B1 * | 10/2001 | Diaz et al. | 361/683 |
| 6,330,155 B1 | 12/2001 | Remsburg | |
| 6,407,916 B1 | 6/2002 | Konstad | |

(Continued)

OTHER PUBLICATIONS

çengel, Y., Heat Transfer: A Practical Approach, McGraw-Hill, 1998, p. 905, p. 167.

(Continued)

Primary Examiner—Kamand Cuneo
Assistant Examiner—Hung S. Bui
(74) Attorney, Agent, or Firm—Fenwick & West LLP

(57) ABSTRACT

An integrated motherboard for a small form factor computer comprises a CPU socket located in a central region of the motherboard. A south bridge/north bridge chipset is located next to the CPU socket towards the front of the motherboard, and a memory module is located next to the south bridge/north bridge chipset towards the front of the motherboard. One or more PCI slots are located on one side of the CPU socket, and a power module is located on the other side of the CPU socket.

8 Claims, 2 Drawing Sheets

U.S. PATENT DOCUMENTS

| | | |
|---|---|---|
| 6,418,018 B1 | 7/2002 | Lo |
| 6,459,576 B1 | 10/2002 | Bhatia et al. |
| 6,525,936 B1 | 2/2003 | Beitelmal et al. |
| 6,567,271 B1 * | 5/2003 | Stone et al. ............... 361/724 |
| 6,587,912 B1 * | 7/2003 | Leddige et al. ............... 711/5 |
| 6,644,979 B1 * | 11/2003 | Huang ........................ 439/65 |
| 6,789,149 B1 * | 9/2004 | Bhadsavle et al. .......... 710/302 |
| 6,813,149 B1 | 11/2004 | Faneuf et al. |
| 2001/0030851 A1 | 10/2001 | Usui et al. |
| 2002/0099925 A1 * | 7/2002 | Chang et al. ............... 712/203 |
| 2005/0017749 A1 * | 1/2005 | Matsuzawa ................. 324/765 |

OTHER PUBLICATIONS

Intel ATX Specification 2.01, Section 1, 1996, pp. 1-27.
Steinberg, D., Cooling Techniques for Electronic Equipment, John Wiley & Sons, Inc., 1991, p. 158, p. 233.

* cited by examiner

PLACEMENT STRUCTURE OF AN INTEGRATED MOTHERBOARD FOR SMALL FORM FACTOR COMPUTER

CROSS REFERENCE TO RELATED APPLICATIONS

This application claims the benefit of U.S. Provisional Application No. 60/456,425, filed Mar. 20, 2003, which is hereby incorporated in its entirety by reference.

BACKGROUND

1. Field of the Invention

The present invention relates to the placement of components on an integrated motherboard, and in particular the placement of a central processing unit (CPU) and other peripheral components on an integrated motherboard for a small form factor computer.

2. Background of the Invention

Technology in the field of integrated circuit (IC) design and manufacturing has progressed rapidly, enabling more powerful and smaller ICs. As a result, peripheral component ICs—such as network chips, modem chips, graphics chips, and audio chips—are often integrated into the motherboard rather than being placed in cards or in external peripheral devices. However, the incorporation of additional components on the motherboard makes the task of placing the components and their respective connectors on the motherboard more difficult without increasing the size of the motherboard.

Manufacturers of CPUs provide specifications for the design of their chips on motherboards. For example, Intel Corporation has provided rules for designing its PENTIUM® 4 CPU and an associated chipset on a motherboard, and motherboard designers must follow those rules to incorporate correctly a PENTIUM® 4 CPU on a motherboard. Designing a motherboard in accordance with these rules, however, may force the motherboard to be larger than desired—especially where the motherboard incorporates a number of other peripheral components. This is especially undesirable for small form factor computers, where the small size of the computer is an important feature. The design of motherboards in accordance with these conventional rules simply fails to achieve the desired result.

Therefore, there is a need for an integrated motherboard having a CPU and peripheral components with their respective connectors placed onto the motherboard without increasing the size of the motherboard. In addition, small form factor computers pack the same components as a regular desktop computer into a smaller space. Heat dissipation from the computer chassis is therefore a greater problem for small form factor computers than for their larger counterparts. Accordingly, it is desirable to arrange the components on the motherboard to facilitate the removal of heat away from the motherboard and the components thereon.

SUMMARY OF THE INVENTION

Accordingly, a CPU and peripheral components are arranged on an integrated motherboard for a small form factor computer, while maintaining the small size of the motherboard and promoting efficient dissipation of heat generated by the components.

In one embodiment, an integrated motherboard for a small form factor computer comprises a CPU socket located in or near a central region of the motherboard, away from the edges of the motherboard. In one embodiment, the CPU socket is located at or near the center of the motherboard. A south bridge/north bridge chipset is located next to the CPU socket towards the front of the motherboard, and a memory module is located next to the south bridge/north bridge chipset towards the front of the motherboard. Additionally, one or more PCI slots are located on one side of the CPU socket, and a power module is located on the other side of the CPU socket.

In an embodiment, the CPU socket, the south bridge/north bridge chipset, and the memory module are located generally in a line on the motherboard from the front to the back thereof. Being located generally in that line, those components (the relatively high heat-producing components) can be cooled efficiently by directing an airflow generally along that line.

In one aspect of an embodiment, the size of the motherboard is less than or equal to 25.4 cm by 18.5 cm, thereby accommodating a small form factor computer.

DETAILED DESCRIPTION OF THE PREFERRED EMBODIMENTS

Figure 1:
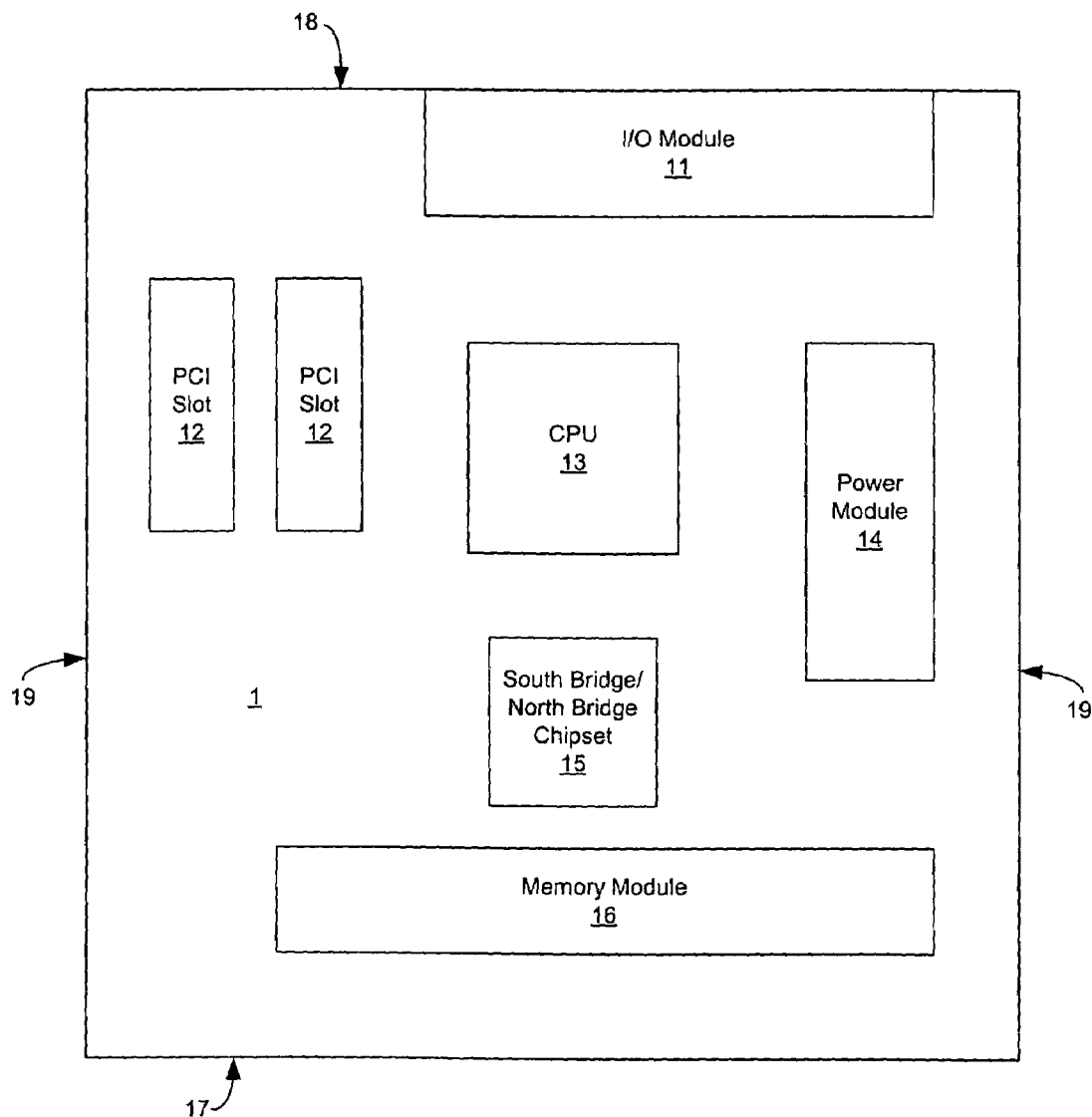
FIG. 1 shows a block diagram of a placement structure of an integrated motherboard in accordance with an embodiment of the present invention.
Figure 2:
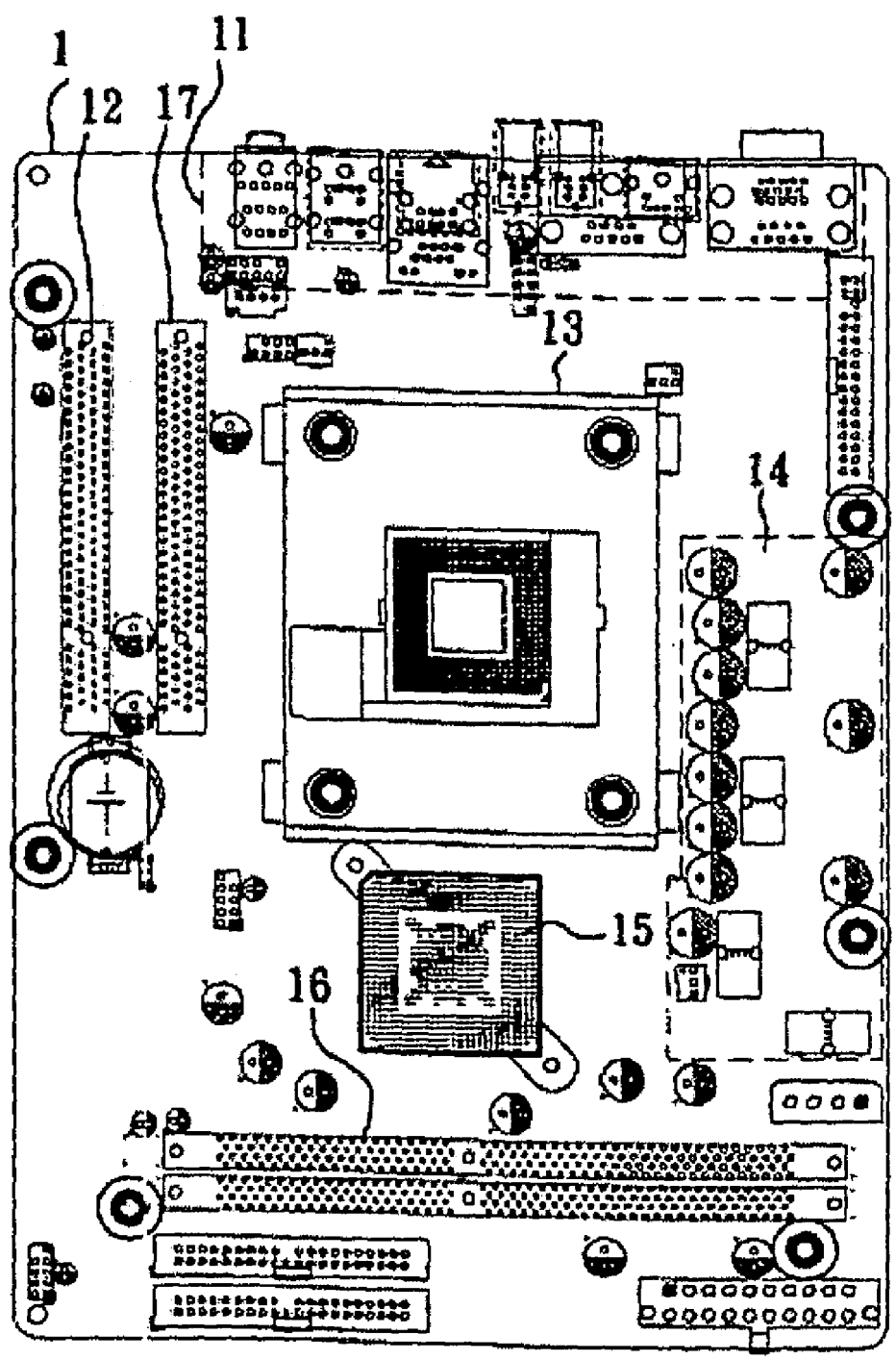
FIG. 2 is a schematic of an integrated motherboard in accordance with an embodiment of the present invention.

FIG. 1 shows a block diagram of a placement structure of an integrated motherboard in accordance with an embodiment of the present invention, and FIG. 2 shows a schematic of an integrated motherboard in accordance with an embodiment of the present invention. For purposes of this description, the motherboard 1 has a front 17, a back 18, and two sides 19. In a typical computer system, the front 17 of the motherboard 1 is oriented towards the computer's front panel, and the back 18 of the motherboard 1 is oriented towards the computer's rear, where most of a computer's interface ports are located.

As shown in FIG. 1, the motherboard 1 includes a CPU socket 13 for receiving a CPU. In one embodiment, the CPU socket 13 is located in a central region of the motherboard 1, and in another embodiment the CPU socket 13 is placed at approximately the center of the motherboard 1. A south bridge/north bridge chipset 15, or its equivalent, is located on the motherboard 1 generally below the CPU socket 13, as shown in FIG. 1. A memory module 16 is located on the motherboard 1 generally forward of the south bridge/north bridge chipset 15. The memory module 16 includes an interface for receiving one or more memory chips (e.g., SDRAM, DDR RAM, etc.) and is typically coupled to the south bridge/north bridge chipset 15. The memory chips themselves need not be included with the memory module 16. In this way, the CPU socket 13, the south bridge/north bridge chipset 15, and the memory module 16 are generally located on the motherboard 1 in a line. Because these components tend to produce a significant amount of the heat in a computer, this arrangement allows for a single air flow path to be directed over these components (e.g., from a fan mounted in the rear of the computer) to remove the heat generated thereby.

Additionally, because the CPU socket 13 is centrally located, one or more PCI slots 12 (and/or an AGP slot and other card interfaces) can be located on the motherboard 1 to one side of the CPU socket 13, and a power module 14 can be located to an opposite side of the motherboard 1 relative to the CPU socket 13. It can be appreciated that a mirror image of the layout shown in FIG. 1 is also possible. An input/output module 11 is located at or near the back 18 of the motherboard 1, above the CPU socket 13 as shown in FIG. 1, to facilitate connections between components on the motherboard 1 and external peripheral devices. Typically, the input/output module 11 includes connection interfaces such as a COM1, COM2, VGA, AV and S terminal, LAN, USB, and/or PS/2.

The arrangement of components on the motherboard 1 as described herein is particularly advantageous for small form factor computers. In one embodiment, the motherboard 1 has a depth, from front 17 to back 18, of 25.4 centimeters or less. Additionally, the motherboard 1 has a width, from side 19 to side 19, of 18.5 centimeters or less.

The foregoing description of the embodiments of the invention has been presented for the purposes of illustration and description. It is not intended to be exhaustive or to limit the invention to the precise forms disclosed. Persons skilled in the relevant art can appreciate that many modifications and variations are possible in light of the above teaching. It is therefore intended that the scope of the invention be limited not by this detailed description, but rather by the claims appended hereto.

I claim:

1. An integrated motherboard for a small form factor computer, the motherboard comprising:
   a CPU socket for receiving a CPU, the CPU socket located in a central region of the motherboard;
   a south bridge/north bridge chipset;
   a memory module wherein the CPU socket, the south bridge/north bridge chipset, and the memory module are disposed on the motherboard in a substantially linear arrangement;
   at least one PCI slot located next to the CPU socket on one side of the linear arrangement; and
   a power module located next to the CPU socket on an opposite side of the linear arrangement.

2. The motherboard of claim 1, wherein the CPU socket is located at approximately the center of the motherboard.

3. The motherboard of claim 1, wherein the motherboard is less than or equal to about 25.4 centimeters in depth and less than or equal to about 18.5 centimeters in width.

4. A motherboard having a front, a back, and two sides, the motherboard comprising:
   a CPU socket located in a central region of the motherboard;
   a south bridge/north bridge chipset located next to the CPU socket towards the front of the motherboard;
   a memory module located next to the south bridge/north bridge chipset towards the front of the motherboard;
   at least one PCI slot located next to the CPU socket towards a side of the motherboard; and
   a power module located next to the CPU socket towards a side of the motherboard opposite the at least one PCI slot.

5. The motherboard of claim 4, further comprising:
   an input/output module located near the back of the motherboard.

6. The motherboard of claim 4, wherein the motherboard is less than or equal to about 25.4 centimeters in depth and less than or equal to about 18.5 centimeters in width.

7. A method of cooling the integrated motherboard of claim 1, comprising directing an air flow in a single path over the linear arrangement of the CPU socket, the south bridge/north bridge chipset, and the memory module to remove the heat generated thereby.

8. A method of cooling the motherboard of claim 4, comprising directing an air flow in a single path over the CPU socket, the south bridge/north bridge chipset, and the memory module to remove the heat generated thereby.

* * * * *

UNITED STATES PATENT AND TRADEMARK OFFICE
CERTIFICATE OF CORRECTION

PATENT NO. : 7,054,165 B2 Page 1 of 1
APPLICATION NO. : 10/631462
DATED : May 30, 2006
INVENTOR(S) : Yi-Lung Kuo It is certified that error appears in the above-identified patent and that said Letters Patent is hereby corrected as shown below:

Column 3, line 34, insert --;-- after "module"; and

Column 4, line 27, delete claims 7 and 8.

Signed and Sealed this

Twelfth Day of December, 2006

JON W. DUDAS
*Director of the United States Patent and Trademark Office*